(12) United States Patent
Okamura et al.

(10) Patent No.: US 9,627,192 B2
(45) Date of Patent: Apr. 18, 2017

(54) SUBSTRATE PROCESSING METHOD, SUBSTRATE PROCESSING APPARATUS, AND COMPUTER-READABLE STORAGE MEDIUM STORED WITH SUBSTRATE PROCESSING PROGRAM

(71) Applicant: Tokyo Electron Limited, Tokyo (JP)

(72) Inventors: Naoyuki Okamura, Kumamoto (JP); Kazuki Kosai, Kumamoto (JP); Kazuhiro Teraoka, Kumamoto (JP); Fumihiro Kamimura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/803,421

(22) Filed: Jul. 20, 2015

(65) Prior Publication Data

US 2016/0027635 A1 Jan. 28, 2016

(30) Foreign Application Priority Data

Jul. 24, 2014 (JP) .................................. 2014-150770
May 22, 2015 (JP) .................................. 2015-104102

(51) Int. Cl.
*B08B 3/00* (2006.01)
*H01L 21/02* (2006.01)
*H01L 21/67* (2006.01)

(52) U.S. Cl.
CPC .. *H01L 21/02041* (2013.01); *H01L 21/67051* (2013.01)

(58) Field of Classification Search
CPC ....... C09D 9/00; B01L 9/52; H01L 21/02041; H01L 21/67051

USPC ........ 134/1, 1.3, 2, 18, 21, 25, 4, 29, 33, 36
See application file for complete search history.

(56) References Cited

U.S. PATENT DOCUMENTS

| | | | |
|---|---|---|---|
| 6,681,781 B2* | 1/2004 | Puri .......................... | B08B 3/08 134/1 |
| 6,890,864 B2 | 5/2005 | Aoki et al. | |
| 7,419,614 B2* | 9/2008 | Kim .................... | C03C 23/0075 134/1.3 |
| 2003/0119318 A1 | 6/2003 | Niuya et al. | |
| 2004/0103915 A1* | 6/2004 | Verhaverbeke ........... | B08B 3/02 134/1.3 |
| 2011/0023909 A1 | 2/2011 | Ito | |
| 2012/0260949 A1 | 10/2012 | Sekiguchi et al. | |

FOREIGN PATENT DOCUMENTS

| | | |
|---|---|---|
| JP | 2002-124502 A | 4/2002 |
| JP | 2004-096055 A | 3/2004 |

* cited by examiner

*Primary Examiner* — Duy Deo
*Assistant Examiner* — Maki Angadi
(74) *Attorney, Agent, or Firm* — Abelman, Frayne & Schwab

(57) ABSTRACT

Disclosed is a substrate processing apparatus (a substrate processing method, and a computer readable storage medium having a substrate processing program stored therein) of cleaning an etched substrate with a polymer removing liquid, in which any of isopropyl alcohol vapor, water vapor, deionized water and isopropyl alcohol, ammonia water, and ammonia water and isopropyl alcohol is supplied to the substrate before the substrate is cleaned with the polymer removing liquid.

9 Claims, 7 Drawing Sheets

SUBSTRATE PROCESSING METHOD, SUBSTRATE PROCESSING APPARATUS, AND COMPUTER-READABLE STORAGE MEDIUM STORED WITH SUBSTRATE PROCESSING PROGRAM

CROSS-REFERENCE TO RELATED APPLICATIONS

This application is based on and claims priority from Japanese Patent Application Nos. 2014-150770 and 2015-104102, filed on Jul. 24, 2014 and May 22, 2015, respectively, with the Japan Patent Office, the disclosures of which are incorporated herein in their entireties by reference.

TECHNICAL FIELD

The present disclosure relates to a substrate processing method and a substrate processing apparatus for cleaning an etched substrate with a polymer removing liquid, and a computer-readable storage medium stored with a substrate processing program.

BACKGROUND

Conventionally, in manufacturing, for example, a semiconductor part or a flat panel display, an etching processing is performed on a substrate such as, for example, a semiconductor wafer or a liquid crystal substrate to form a circuit pattern.

Since the etched substrate has residues such as fluorine attached on its surface, the substrate is cleaned with a polymer removing liquid (see, e.g., Japanese Patent Laid-Open Publication No. 2002-124502).

SUMMARY

The present disclosure provides a substrate processing method of cleaning an etched substrate with a polymer removing liquid. Before the substrate is cleaned with the polymer removing liquid, isopropyl alcohol vapor or water vapor is supplied to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
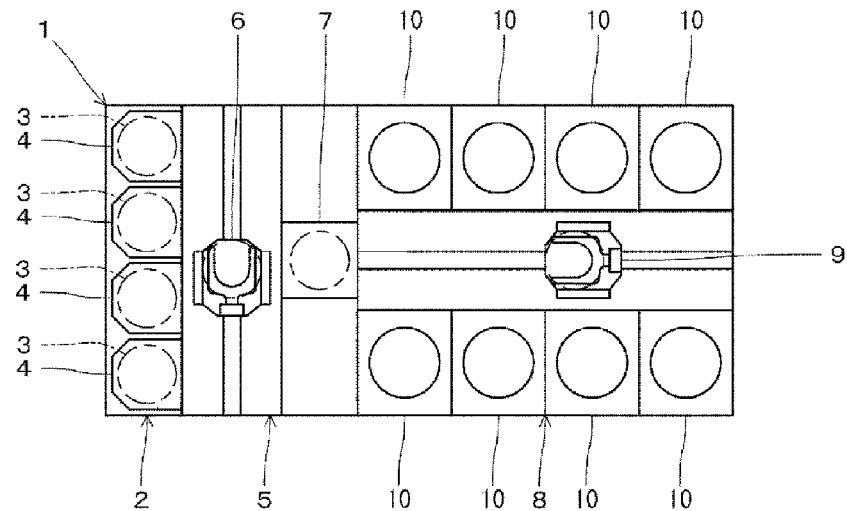
FIG. 1 is a plan view illustrating a substrate processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to enhance a cleaning effect by a polymer removing liquid.

According to an aspect, the present disclosure provides a substrate processing method of cleaning an etched substrate with a polymer removing liquid in which isopropyl alcohol vapor or water vapor is supplied to the substrate before the substrate is cleaned with the polymer removing liquid.

According to an aspect, the present disclosure further provides a substrate processing method of cleaning an etched substrate with a polymer removing liquid, in which deionized water and isopropyl alcohol are supplied to the substrate at the same time before the substrate is cleaned with the polymer removing liquid.

In the above-mentioned substrate processing method, isopropyl alcohol is solely supplied to the substrate before the deionized water and the isopropyl alcohol are supplied at the same time.

In the above-mentioned substrate processing method, isopropyl alcohol is solely supplied to the substrate after the deionized water and the isopropyl alcohol are supplied at the same time.

In the above-mentioned substrate processing method, a rotation speed of the substrate when the isopropyl alcohol is solely supplied is higher than that of the substrate when the deionized water and the isopropyl alcohol are supplied at the same time.

In the above-mentioned substrate processing method, a ratio of a supply amount of the deionized water and a supply amount of the isopropyl alcohol is 5:1 to 1:1.

According to an aspect, the present disclosure further provides a substrate processing method of cleaning an etched substrate with a polymer removing liquid, in which ammonia water is supplied to the substrate, or ammonia water and isopropyl alcohol are supplied to the substrate at the same time before the substrate is cleaned with the polymer removing liquid.

According to another aspect, the present disclosure provides a substrate processing apparatus including: a removing liquid supplying unit configured to supply a polymer removing liquid to an etched substrate; and a pre-treatment agent supplying unit configured to supply a pre-treatment agent to the substrate before the polymer removing liquid is supplied from the removing liquid supplying unit, in which the pre-treatment agent supplying unit supplies isopropyl vapor or water vapor to the substrate.

According to another aspect, the present disclosure further provides a substrate processing apparatus including: a removing liquid supplying unit configured to supply a polymer removing liquid to an etched substrate; and a pre-treatment agent supplying unit configured to supply a pre-treatment agent to the substrate before the polymer removing liquid is supplied from the removing liquid supplying unit, wherein the pre-treatment agent supplying unit supplies deionized water and isopropyl to the substrate at the same time.

In the above-mentioned substrate processing apparatus, the pre-treatment agent supplying unit supplies the isopropyl alcohol solely to the substrate before the deionized water and the isopropyl alcohol are supplied at the same time.

In the above-mentioned substrate processing apparatus, the pre-treatment agent supplying unit supplies the isopropyl alcohol solely to the substrate after the deionized water and the isopropyl alcohol are supplied at the same time.

In the above-mentioned substrate processing apparatus, in the pre-treatment agent supplying unit, a rotation speed of the substrate when the isopropyl alcohol is solely supplied is higher than that of the substrate when the deionized water and the isopropyl alcohol are supplied at the same time.

In the above-mentioned substrate processing apparatus, in the pre-treatment agent supplying unit, a ratio of a supply amount of the deionized water and a supply amount of the isopropyl alcohol is 5:1 to 1:1.

According to another aspect, the present disclosure further provides a substrate processing apparatus including: a removing liquid supplying unit configured to supply a polymer removing liquid to an etched substrate; and a pre-treatment agent supplying unit configured to supply a pre-treatment agent to the substrate before the polymer removing liquid is supplied from the removing liquid supplying unit, in which the pre-treatment agent supplying unit supplies ammonia water to the substrate, or supplies ammonia water and isopropyl alcohol to the substrate at the same time.

According to still another aspect, the present disclosure provides a non-transitory computer-readable storage medium stored with a substrate processing program which, when executed, causes a computer to control a substrate processing apparatus to clean an etched substrate with a polymer removing liquid, the apparatus including: a removing liquid supplying unit configured to supply the polymer removing liquid to the etched substrate; and a pre-treatment agent supplying unit configured to supply a pre-treatment agent to the substrate before the polymer removing liquid is supplied from the removing liquid supplying unit, in which isopropyl alcohol vapor or water vapor is supplied to the substrate before the substrate is cleaned with the polymer removing liquid.

According to still another aspect, the present disclosure further provides a non-transitory computer-readable storage medium stored with a substrate processing program which, when executed, causes a computer to control a substrate processing apparatus to clean an etched substrate with a polymer removing liquid, the apparatus including: a removing liquid supplying unit configured to supply the polymer removing liquid to the etched substrate; and a pre-treatment agent supplying unit configured to supply a pre-treatment agent to the substrate before the polymer removing liquid is supplied from the removing liquid supplying unit, in which deionized water and isopropyl alcohol are supplied to the substrate at the same time before the substrate is cleaned with the polymer removing liquid.

In the above-mentioned storage medium, a ratio of a supply amount of the deionized water and a supply amount of the isopropyl alcohol is 5:1 to 1:1.

According to still another aspect, the present disclosure further provides a non-transitory computer-readable storage medium stored with a substrate processing program which, when executed, causes a computer to control a substrate processing apparatus to clean an etched substrate with a polymer removing liquid, the apparatus including: a removing liquid supplying unit configured to supply the polymer removing liquid to the etched substrate; and a pre-treatment agent supplying unit configured to supply a pre-treatment agent to the substrate before the polymer removing liquid is supplied from the removing liquid supplying unit, in which ammonia water is supplied to the substrate, or ammonia water and isopropyl alcohol are supplied to the substrate at the same time before the substrate is cleaned with the polymer removing liquid.

In the present disclosure, the effect of cleaning the etched substrate with the polymer removing liquid may be enhanced.

Hereinafter, configurations of the substrate processing method and the substrate processing apparatus according to the present disclosure will be described in detail with reference to the drawings.

As illustrated in FIG. 1, a substrate processing apparatus 1 includes a carry-in/out section 2 formed in its front end portion. In the carry-in/out section 2, carriers 4 are placed side by side in a left and right direction and carried into or out of the carry-in/out section 2. Each of the carriers accommodates a plurality (e.g., twenty five sheets) of substrates 3 (semiconductor wafers herein).

Further, the substrate processing apparatus 1 includes a conveyance section 5 at the rear of the carry-in/out section 2. In the conveyance section 5, a substrate conveyance device 6 is disposed at the front side, and a substrate delivery table 7 is disposed at the rear side. In the conveyance section 5, the substrates 3 are conveyed by the substrate conveyance device 6 between any one of the carriers 4 disposed in the carry-in/out section 2 and the substrate delivery table 7.

Further, the substrate processing apparatus 1 includes a processing section 8 at the rear of the conveyance section 5. In the processing section 8, a substrate conveyance device 9 which extends back and forth in the center, and substrate liquid processing devices 10 are disposed side by side at both sides of the substrate conveyance device 9 to perform a liquid processing on the substrates 3. In the processing section 8, the substrates 3 are conveyed by the substrate conveyance device 9 between the substrate delivery table 7 and the substrate liquid processing devices 10, and the liquid processing of the substrates 3 is performed using the substrate liquid processing devices 10.

Figure 2:
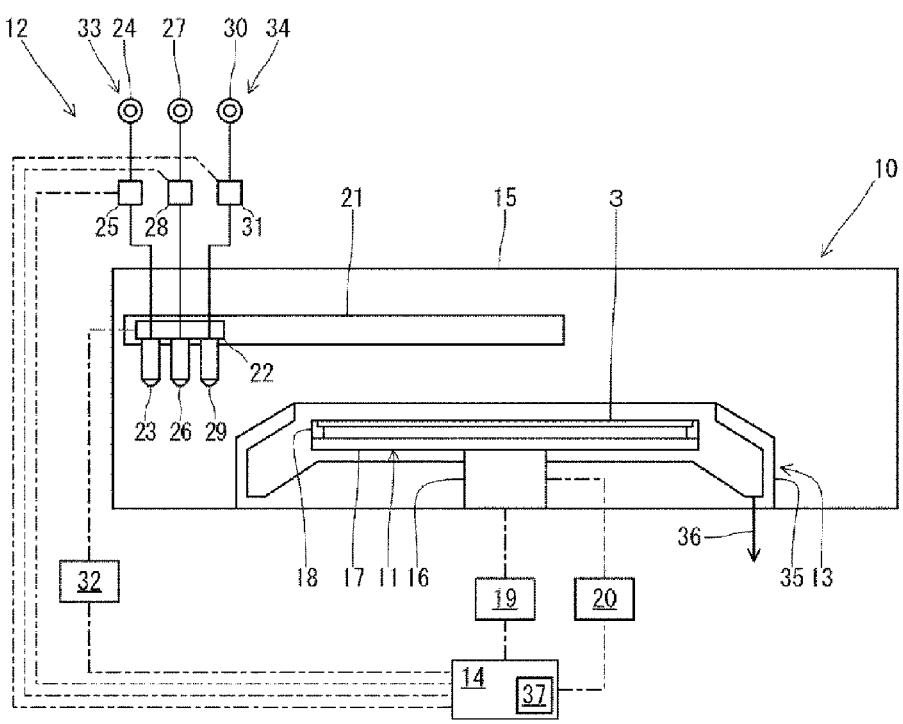
FIG. 2 is a side view illustrating a substrate liquid processing apparatus.

As illustrated in FIG. 2, each substrate liquid processing device 10 includes a substrate rotating unit 11, a processing liquid supplying unit 12, and a processing liquid recovering unit 13, which are controlled by a control unit 14. Here, the substrate rotating unit 11 holds and rotates the substrate 3. The processing liquid supplying unit 12 supplies various processing liquids to the substrate 3. The processing liquid recovering unit 13 recovers the various processing liquids. The control unit 14 controls the entire substrate processing apparatus 1.

The substrate rotating unit 11 is rotatably provided with a rotary shaft 16 that extends vertically in the substantially central portion inside a processing chamber 15. A disc-shaped turntable 17 is attached horizontally to the upper end of the rotary shaft 16. Three substrate holders 18 are attached to an outer peripheral edge of the turntable 17 at equal intervals in the circumferential direction.

Further, in the substrate rotating unit 11, the rotary shaft 16 is connected to a substrate rotating mechanism 19 and a substrate elevating mechanism 20. The rotation of the rotating mechanism 19 and the elevation of the substrate elevating mechanism are controlled by the control unit 14.

The substrate rotating unit 11 holds the substrate 3 horizontally by the substrate holders 18 of the turntable 17. Further, the substrate rotating unit 11 rotates the substrate 3 held on the turntable 17 by driving the substrate rotating mechanism 19. In addition, the substrate rotating unit 11 elevates the turntable 3 or the substrate 3 by driving the substrate elevating mechanism 20.

In the processing liquid supplying unit 12, a guide rail 21 that extends horizontally in the left and right direction is provided in the processing chamber 15, and an arm 22 that extends horizontally in the back and forth direction is provided in the guide rail 21 to be movable left and right. A deionized water supplying nozzle 23 is attached vertically downwardly to the lower left side of the front end of the arm 22. The deionized water supply nozzle 23 is connected with a deionized water source 24 via a flow rate adjustor 25. An IPA supply nozzle 26 is attached vertically downwardly to the lower central side of the front end of the arm 22. The IPA supply nozzle 26 is connected with an IPA source 27 via a flow rate adjustor 28. Further, a polymer removing liquid supply nozzle 29 is attached vertically downwardly to the lower right side of the front end of the arm 22. The polymer removing liquid supply nozzle 29 is connected with a polymer removing liquid source 30 via a flow rate adjustor 31. The flow rates of the flow rate adjustors 25, 28, 31 are controlled by the control unit 14.

In the processing liquid supplying unit 12, the arm 22 is connected with a nozzle moving mechanism 32. The movement of the nozzle moving mechanism 32 is controlled by the control unit 14.

The processing liquid supplying unit 12 moves the front end of the arm 22 (the deionized water supply nozzle 23, the IPA supply nozzle 26, and the polymer removing liquid supply nozzle 29) between a standby position outside the substrate 3 and an ejection position at the central portion of the substrate 3 by driving the nozzle moving mechanism 32. Further, the processing liquid supplying unit 12 ejects deionized water, IPA, and a polymer removing liquid toward the substrate 3 from the deionized water supply nozzle 23, the IPA supply nozzle 26, and the polymer removing liquid supply nozzle 29 using the flow rate adjustors 25, 28, 31. Further, as described below, the processing liquid supply unit 12 functions as a pre-treatment agent supplying unit 33 to supply the deionized water and the IPA from the deionized water supply nozzle 23 and the IPA supply nozzle 26 to the substrate 3 at the same time before the substrate 3 is subjected to a cleaning processing with the polymer removing liquid (at the time of a pre-treatment). In addition, the processing liquid supplying unit 12 functions as a removing liquid supplying unit 34 to supply the polymer removing liquid from the polymer removing liquid supply nozzle 29 to the substrate 3 when the substrate 3 is subjected to the cleaning processing with the polymer removing liquid.

In the processing liquid recovering unit 13, an annular recovery cup 35 is disposed around the turntable 17. An opening, which is one size larger than the turntable 17 (the substrate 3), is formed in the upper end portion of the recovery cup 35. Further, a drain 36 is connected to the lower end portion of the recovery cup 35.

The processing liquid recovering unit 13 recovers the processing liquids supplied to the surface of the substrate 3 into the recovery cup 35 and discharges the recovered processing liquids from the drain 36 to the outside.

The substrate processing apparatus 1 is configured as described above, and controlled by the control unit 14 according to various programs recorded in a storage medium 37 installed in the control unit (computer) 14 to perform a processing of the substrate 3. Here, the storage medium 37 stores various setting data or programs and is configured with a well-known medium, for example, a memory such as ROM or RAM, or a disk type storage medium such as a hard disk, a CD-ROM, a DVD-ROM, or a flexible disk.

Then, the substrate processing apparatus 1 performs a processing on an etched substrate 3 according to a substrate processing program recorded in the storage medium 37, as described below.

First, the substrate processing apparatus 1 receives the substrate 3 conveyed by the substrate conveyance device 9 with the substrate liquid processing device 10 (substrate receiving step).

In the substrate receiving step, the control unit 14 causes the turntable 17 to be moved up to a predetermined position by the substrate elevating mechanism 20. Then, one substrate 3 conveyed from the substrate conveyance device 9 to the inside of the processing chamber 15 is received to be held horizontally by the substrate holders 18. Thereafter, the turntable 17 is moved down to a predetermined position by the substrate elevating mechanism 20. Further, in the substrate receiving step, the arm 22 (the deionized water supply nozzle 23, the IPA supply nozzle 26, and the polymer removing liquid supply nozzle 29) is allowed to retreat to the standby position outward from the outer periphery of the turntable 17.

Figure 3:
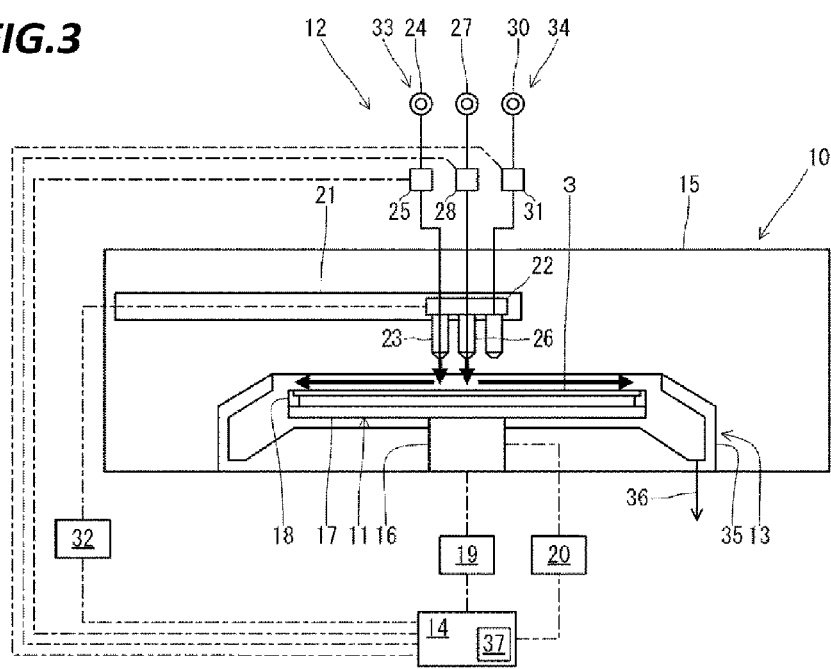
FIG. 3 is an explanatory view illustrating a substrate processing method (pre-treatment step).

Next, as illustrated in FIG. 3, the substrate processing apparatus 1 performs a pre-treatment on the substrate 3 by supplying a pre-treatment agent to the surface of the substrate 3 (pre-treatment step). Here, descriptions will be made on a case where the deionized water and the IPA are used as a pre-treatment agent, which will be described in more detail later.

In the pre-treatment step, the control unit 14 causes the arm 22 to be moved by the nozzle moving mechanism 32 such that the IPA supply nozzle 26 is disposed at the ejection position above the central portion of the substrate 3. Further, the substrate 3 is rotated by rotating the turntable 17 at a predetermined rotation speed by the substrate rotating mechanism 19. Thereafter, the deionized water and the IPA, of which the flow rates are respectively controlled by the flow rate adjustors 25, 28, are ejected from the deionized water supply nozzle 23 and the IPA supply nozzle 26 toward the surface (upper surface) of the substrate 3 at the same time. The deionized water and the IPA supplied to the substrate 3 are stirred and mixed on the surface of the rotating substrate 3, and the mixed liquid of the deionized water and the IPA flows from the center of the substrate 3 toward the outer peripheral edge along the surface of the substrate 3. As a result, the surface of the substrate 3 is pre-treated with the mixed liquid of the deionized water and the IPA. The deionized water and the IPA supplied to the substrate 3 are scattered outward from the outer periphery of the substrate 3 by the centrifugal force of the rotating substrate 3, recovered in the recovery cup 35, and discharged from the drain 36 to the outside. After the pre-treatment agent composed of the deionized water and the IPA is supplied for a predetermined period of time, the ejection of the deionized water and the IPA is stopped by the flow rate adjustors 25, 28.

In the pre-treatment step, the deionized water and the IPA may be supplied to the surface of the substrate 3 at the same time. However, the timing of starting or stopping the supply of the deionized water and the IPA may be different. In this case, the supply of the IPA may be started before the supply of the deionized water. The water repellency of the surface of the substrate 3 is high due to the presence of fluorine contained in the polymer. Therefore, when the IPA is firstly ejected to the substrate 3, the wettability of the substrate 3 may be enhanced, and thus, the surface of the substrate 3 may be coated with the IPA. When the deionized water is then ejected, the deionized water may be spread evenly on the entire surface of the substrate 3, and the polymer is swollen by the deionized water. Due to this, it is considered that the subsequent polymer removal effect by the polymer removing liquid is enhanced. The rotation speed of the substrate 3 when the deionized water and the IPA are supplied at the same time is set to a speed capable of maintaining a liquid film of the deionized water and the IPA. When the IPA is solely supplied before the deionized water and the IPA are supplied at the same time, a liquid film of the IPA may be formed on the entire surface of the substrate 3 more rapidly by rotating the substrate 3 at a higher speed than that of the substrate 3 when the deionized water and the IPA are supplied at the same time. Further, the supply of the IPA may be stopped before the supply of the deionized water is stopped. When the supply of the deionized water is stopped and only the IPA is supplied, the surface of the substrate 3 is coated with the IPA. Thereafter, when the supply of the IPA is stopped and the polymer removing liquid is supplied, it is thought that the replacement with the polymer removing liquid is improved, and thus, the polymer removal effect is enhanced. In a case where the IPA is solely supplied after the deionized water and the IPA is supplied at the same time, the substrate 3 is rotated at a rotation speed higher than the rotation speed of the substrate 3 when the deionized water and the IPA are supplied at the same time, so that the film thickness of the liquid film of the IPA formed on the surface of the substrate 3 may be thinner, and the subsequent replacement with the polymer removing liquid may be further enhanced. Further, the polymer removing liquid may be supplied after the supply of the IPA is stopped and the substrate 3 is rotated at a rotation speed capable of maintaining the liquid film for a short period of time. Since the liquid film of the IPA becomes thinner, the subsequent replacement with the polymer removing liquid may be further enhanced.

Figure 4:
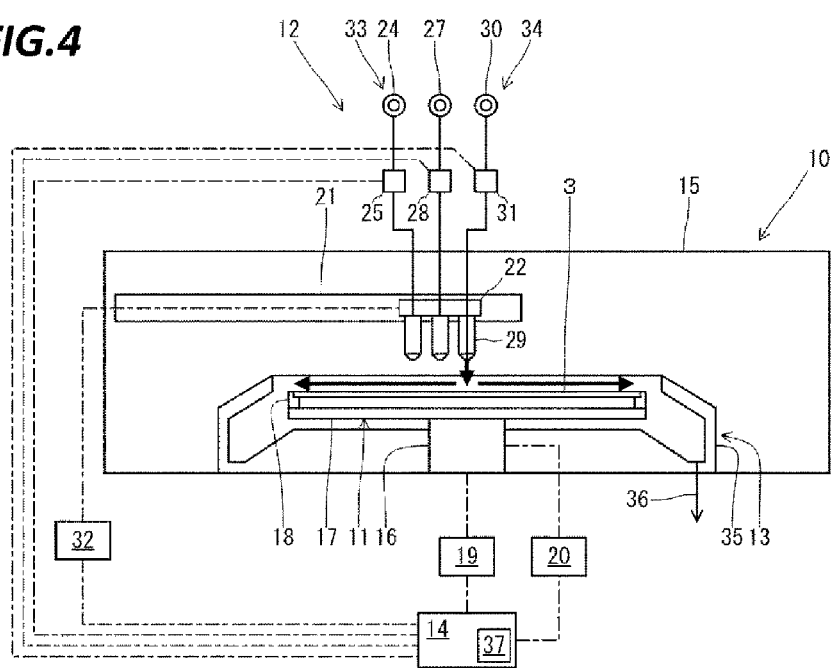
FIG. 4 is an explanatory view illustrating the substrate processing method (cleaning processing step).

Next, as illustrated in FIG. 4, the substrate processing apparatus 1 performs the cleaning processing on the substrate 3 by supplying the polymer removing liquid to the surface of the substrate 3 (cleaning processing step). Thus, the pre-treatment agent composed of the deionized water and the IPA is washed away from the surface of the substrate 3, and a liquid film of the polymer removing liquid is formed on the surface of the substrate 3.

In the cleaning processing step, the control unit 14 causes the turntable 17 to be rotated rotating at a predetermined rotation speed by the substrate rotating mechanism 19 so as to continuously rotate the substrate 3, and in that state, causes the arm 22 to be moved by the nozzle moving mechanism 32 such that the polymer removing liquid supply nozzle 29 is disposed at the ejection position above the central portion of the substrate 3. Then, the polymer removing liquid, which is controlled at a predetermined flow rate by the flow rate adjustor 31, is ejected from the polymer removing liquid supply nozzle 29 toward the surface of the substrate 3. Accordingly, the surface of the substrate 3 is cleaned with the polymer removing liquid. The polymer removing liquid supplied to the substrate 3 is scattered outward from the outer periphery of the substrate 3 by the centrifugal force of the rotating substrate 3, recovered in the recovery cup 35, and discharged from the drain 36 to the outside. After the polymer removing liquid is supplied for a predetermined period of time, the ejection of the polymer removing liquid is stopped by the flow rate adjustor 31.

Next, the substrate processing apparatus 1 performs a rinse processing on the substrate 3 by supplying the deionized water to the surface of the substrate 3 (rinse processing step). Thus, the polymer removing liquid is washed away from the surface of the substrate 3, and a liquid film of the deionized water is formed on the surface of the substrate 3.

In the rinse processing step, the control unit 14 causes the turntable 17 to be rotated at a predetermined rotation speed by the substrate rotating mechanism 19 so as to continuously rotate the substrate 3, and in that state, causes the arm 22 to be moved by the nozzle moving mechanism 32 such that the deionized water supply nozzle 23 is disposed at the ejection position above the central portion of the substrate 3. Then, the deionized water, of which the flow rate is controlled by the flow rate adjustor 25, is ejected from the deionized water supply nozzle 23 toward the surface of the substrate 3. Accordingly, the surface of the substrate 3 is rinsed with the deionized water. The deionized water supplied to the substrate 3 is scattered outward from the outer periphery of the substrate 3 by the centrifugal force of the rotating substrate 3, recovered in the recovery cup 35, and discharged from the drain 36 to the outside. After the deionized water is supplied for a predetermined period of time, the ejection of the deionized water is stopped by the flow rate adjustor 25. Further, even after the ejection of the deionized water is stopped, the substrate 3 is continuously rotated such that the deionized water is scattered from the surface of the substrate 3.

Next, the substrate processing apparatus 1 performs a drying processing on the substrate 3 to dry the surface of the substrate 3 (drying processing step).

In the drying processing step, the control unit 14 causes the turntable 17 to be rotated at a predetermined rotation speed (higher than the rotation speeds in the pre-treatment step, the cleaning processing step, and the rinse processing step) by the substrate rotating mechanism 19, thereby continuously rotating the substrate 3. Accordingly, the surface of the substrate 3 is dried. Further, in the drying processing step, the arm 22 (the deionized water supply nozzle 23, the IPA supply nozzle 26, and the polymer removing liquid supply nozzle 29) is moved to retreat to the standby position outward from the outer periphery of the turntable 17.

Finally, the substrate processing apparatus 1 delivers the substrate 3 from the substrate liquid processing device 10 to the substrate conveyance device 9 (substrate delivery step).

In the substrate delivery step, the control unit 14 caused the turntable 17 to be moved up to a predetermined position by the substrate elevating mechanism 20. Then, the substrate 3 held on the turntable 17 is delivered to the substrate conveyance device 9. Thereafter, the turntable 17 is moved down to a predetermined position by the substrate elevating mechanism 20.

As described above, in the substrate processing apparatus 1 (the substrate processing method performed by the substrate processing apparatus 1), the etched substrate 3 is pre-treated with the pre-treatment agent, and then, cleaned with the polymer removing liquid.

Figure 5:
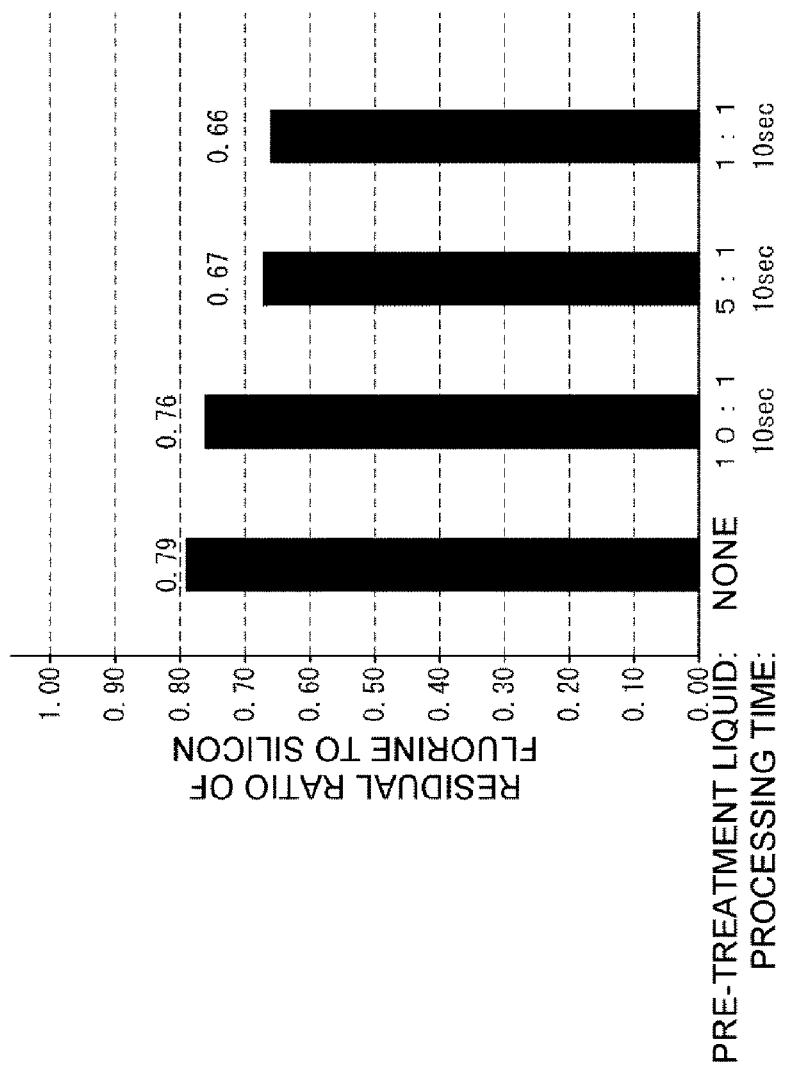
FIG. 5 is a graph illustrating an effect when deionized water and isopropyl alcohol (IPA) are used as a pre-treatment agent.
Figure 6:
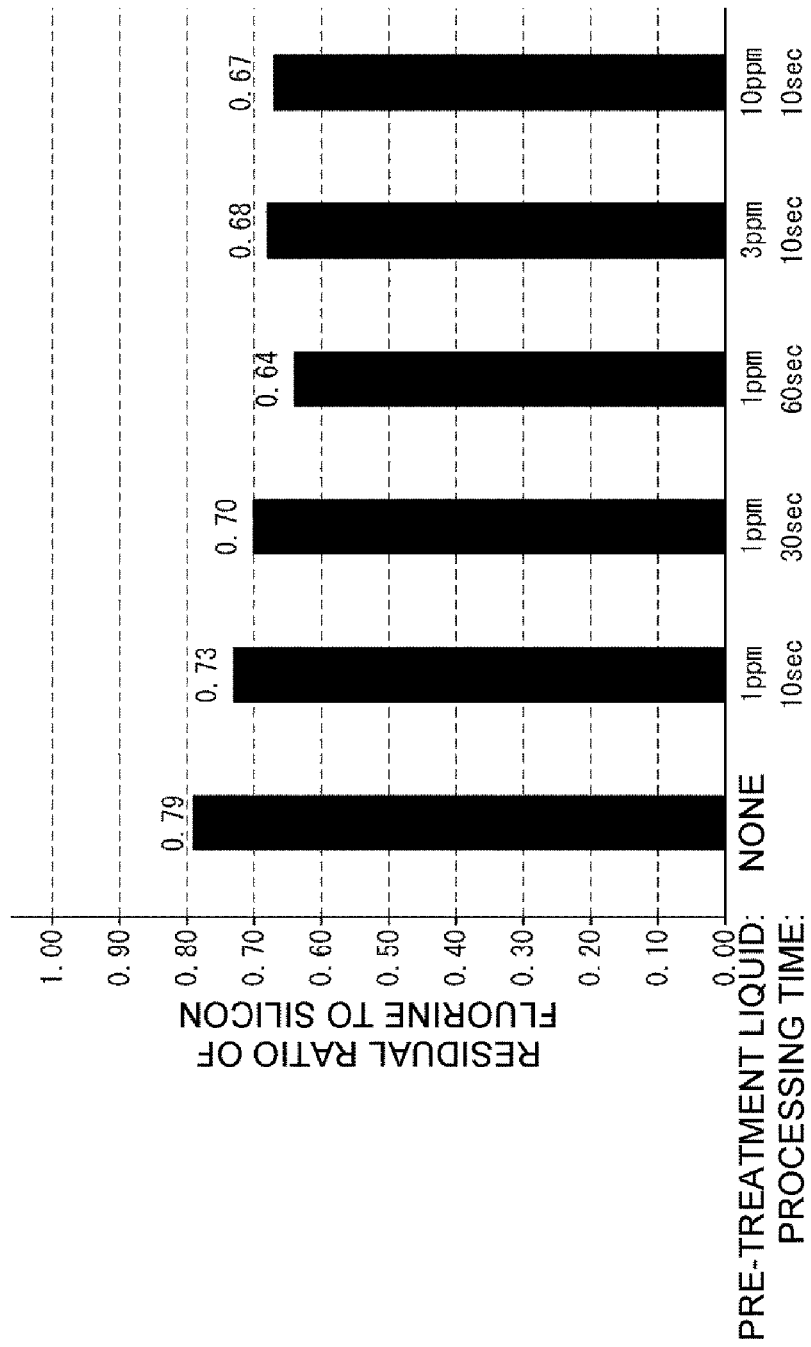
FIG. 6 is a graph illustrating an effect when ammonia water is used as a pre-treatment agent.
Figure 7:
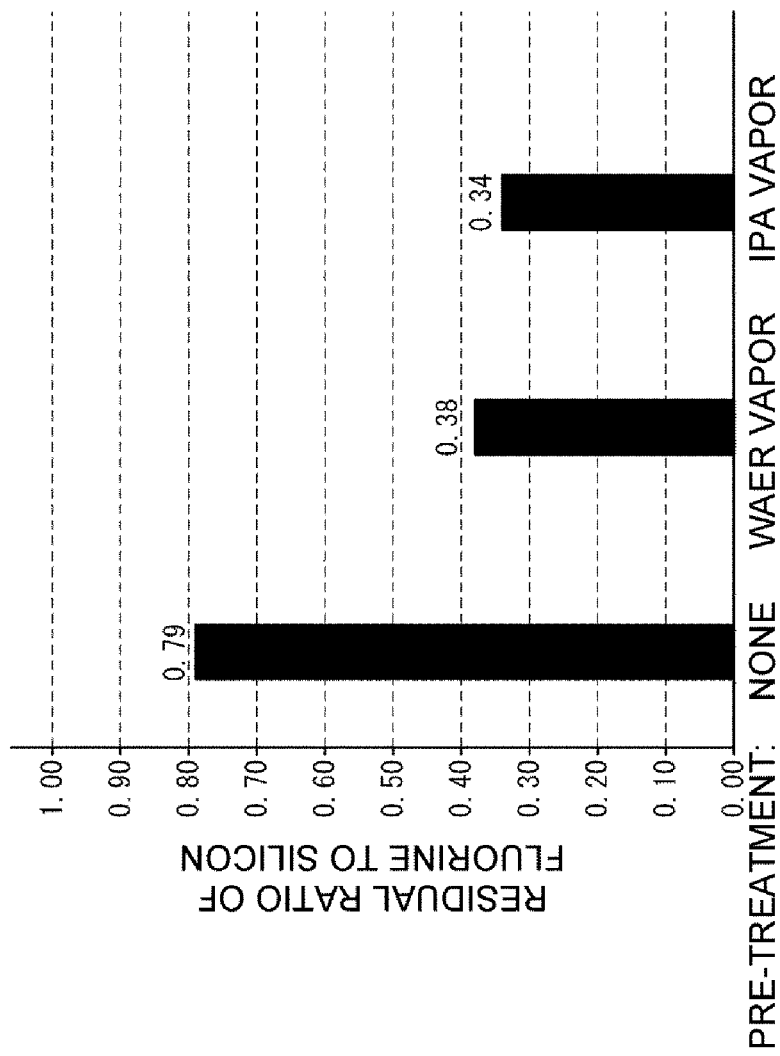
FIG. 7 is a graph illustrating an effect when water vapor is used as a pre-treatment agent.

In the substrate processing apparatus 1, the pre-treatment agent composed of the deionized water and the IPA is used. Conventionally, the polymer removing liquid has been solely used. In the present disclosure, an experiment on the pre-treatment agent was performed to review a cleaning processing method which has an excellent cleaning effect, as compared with a conventional method. The results are shown in FIGS. 5 to 7. The vertical axis in FIGS. 5 to 7 represents a cleaning effect by the pre-treatment agent, indicating a residual ratio of the number of fluorine remaining on the surface of the substrate 3 non-dimensionalized with the number of silicon after the surface of the substrate 3 was dry-etched with a fluorine-containing gas, then, subjected to the pre-treatment with the pre-treatment agent, and then, subjected to the cleaning processing with the polymer removing liquid. Here, a residual ratio in the case where the pre-treatment or the cleaning processing was performed is calculated by assuming that the residual ratio of the surface of the substrate 3 dry-etched with the fluorine-containing gas (in the case where neither the pre-treatment nor the cleaning processing was performed) as 1.00.

As illustrated in FIG. 5, in a case where the cleaning processing was performed only with a conventional polymer removing liquid but the pre-treatment was not performed, the residual ratio was 0.79 (the left end in FIG. 5). On the contrary, in a case where the pre-treatment was performed for 10 seconds, when the ratio of the deionized water and the IPA was set to 10:1, the residual ratio was 0.76, which was improved as compared with the conventional case. When the ratio of the deionized water and the IPA was 5:1, the residual ratio was 0.67, which was further improved. When the ratio of the deionized water and the IPA was 1:1, the residual ratio was 0.66, which was furthermore improved. It is thought that, as the ratio of the IPA increases, the wettability of the surface of the substrate 3 is enhanced, and the deionized water or the polymer removing liquid is likely to be spread evenly on the entire surface of the substrate.

Accordingly, in the present disclosure, the deionized water and the IPA were supplied as the pre-treatment agent at the same time. Thus, the cleaning effect by the polymer removing liquid may be enhanced. The deionized water and the IPA may be ejected from the different nozzles, as in the substrate processing apparatus 1, to the substrate 3 and mixed on the surface of the substrate 3. Or, a mixed liquid, which is mixed in advance, may be ejected from one nozzle to the substrate 3. The ratio of the supply amount of the deionized water and the supply amount of the IPA to the substrate 3 may be 5:1 to 1:1.

FIG. 6 illustrates a result of the experiment performed in a case where ammonia water was used as a pre-treatment agent. As illustrated in FIG. 6, in a case where the cleaning processing was performed only with a conventional polymer removing liquid but the pre-treatment was not performed, the residual ratio was 0.79 (the left end in FIG. 6). On the contrary, in a case where ammonia water was used as the pre-treatment agent, when the pre-treatment time was set to 10 second in the ammonia water at a concentration of 1 ppm, the residual ratio was 0.73, which was improved as compared with the conventional case. When the pre-treatment time was changed to 30 seconds or 60 seconds, the residual ratio was improved to 0.70 or 0.67. Further, when the pre-treatment time remained at 10 seconds and the concentration of the ammonia water was changed from 1 ppm to 3 ppm or 10 ppm, the residual ratio was improved to 0.68 or 0.67. Further, when the ammonia water and the IPA were used, the result was the same as that in the case where the deionized water and the IPA were used.

In this regard, even though the ammonia water, or the ammonia water and the IPA are used as the pre-treatment agent, the cleaning effect by the polymer removing liquid may be enhanced. The concentration of the ammonia water may be 1 ppm or more. When the concentration is 1 ppm, the pre-treatment time may be 30 seconds or more.

FIG. 7 illustrates a result of the experiment performed in a case where water vapor or isopropyl alcohol vapor (IPA vapor) was used as the pre-treatment agent. As illustrated in FIG. 7, in a case where the cleaning processing was performed only with a conventional polymer removing liquid but the pre-treatment was not performed, the residual ratio was 0.79 (the left end in FIG. 7). On the contrary, in a case where water vapor was used as the pre-treatment agent, the residual ratio was 0.68, which was considerably improved as compared with a conventional case. Further, when IPA vapor was used as the pre-treatment agent, the residual ratio was 0.34, which was further improved.

In this regard, even though the water vapor or the IPA vapor is used as the pre-treatment agent, the cleaning effect by the polymer removing liquid may be enhanced. When the water vapor or the IPA vapor is used as the pre-treatment agent, the surface of the polymer may be covered with a thin liquid film by the vapor, so that the wettability of the surface is enhanced. Further, the polymer may be swollen by heat of the vapor, so that a gap in the polymer may be widened. Thus, it is thought that the subsequent polymer removing liquid may be spread evenly on the entire surface of the substrate 3 and penetrate well into the polymer, so that the cleaning effect by the polymer removing liquid may be remarkably enhanced. The vapor may be water vapor, but IPA vapor is preferable to the water vapor because the IPA vapor may swell the entire polymer without being bounced to the polymer.

In a case where ammonia or vapor is used as the pre-treatment agent, similarly to the processing liquid supplying unit 12, a pre-treatment agent supplying unit 33 is provided in the substrate processing apparatus 1 to eject the ammonia or the vapor. In a case where the vapor is used as the pre-treatment agent, a substrate processing apparatus 38 or 39 as illustrated in FIGS. 8A and 8B or FIGS. 9A and 9B may be used. In the following description, the components having the same functions as those of the substrate processing apparatus 1 will be given the same reference numerals, and descriptions thereof will be omitted.

Each of the substrate processing apparatuses 38, 39 as illustrated in FIGS. 8A and 8B and FIGS. 9A and 9B includes a substrate rotating unit 11, a pre-treatment supplying unit 33, and a polymer removing liquid supplying unit 34 that are provided in a casing 40. The casing 40 is a sealable container and configured to prevent vapor, which is a pre-treatment agent, from leaking from the inside of the casing 40 to the outside. The pre-treatment supplying unit 33 ejects the vapor toward the surface of a substrate 3. In the polymer removing liquid supplying unit 34, an arm 43 that extends horizontally in a back and forth direction is attached to an upper portion of a moving body 42 that moves along a guide rail 41, and a polymer removing liquid supply nozzle 44 is attached to a front end of the arm 43. The polymer removing liquid supplying unit 34 ejects a polymer removing liquid toward the surface of the substrate 3 from the polymer removing liquid ejection port 45 formed in the lower portion of the polymer removing liquid supply nozzle 44. Here, the polymer removing liquid supplying unit 34 supplies a polymer removing liquid from a position where the polymer removing liquid does not bounce off (a distance from the surface of the substrate 3). On the contrary, when the vapor is ejected toward the substrate 3, the bounce-off hardly occurs. Therefore, the pre-treatment agent supplying unit 33 is configured to eject the vapor from a position lower than the polymer removing liquid supplying unit 34 (a position at a short distance from the surface of the substrate 3), so that the ejected vapor reaches the surface of the substrate 3 before the vapor is cooled and becomes a water droplet.

Figure 8A:
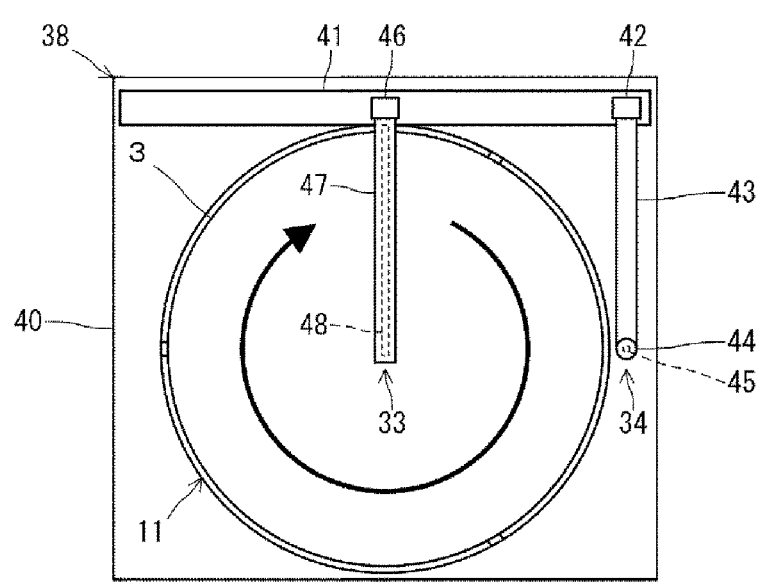
FIGS. 8A and 8B are a plan view and a side view illustrating a substrate processing apparatus.
Figure 8B:
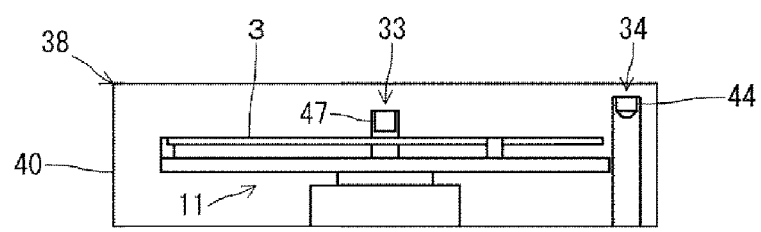

In the pre-treatment supplying unit 33 of the substrate processing apparatus 38 as illustrated in FIGS. 8A and 8B, a vapor supply nozzle 47 that extends horizontally in the back and forth direction is attached to an upper portion of a moving body 46 that moves along the guide rail 41, and a slit-shaped vapor ejection port 48 that extends linearly in the back and forth direction is formed in the lower portion of the vapor supply nozzle 47. The vapor is ejected from the vapor ejection port 48 toward the surface of the substrate 3. The vapor ejection port 48 (the vapor supply nozzle 47) extends from the center of the substrate 3 to the peripheral portion so as to be longer than the radius of the substrate 3.

In addition, in the substrate processing apparatus 38 as illustrated in FIGS. 8A and 8B, the vapor is ejected from the vapor supply nozzle 47 to the surface of the substrate 3 by moving the vapor supply nozzle 47 to a position above the center of the substrate 3 and then rotating the substrate 3 by the substrate rotating unit 11. Therefore, the vapor is supplied to the entire surface of the substrate 3. Then, the polymer removing liquid is ejected from the polymer removing liquid supply nozzle 44 to the surface of the substrate 3 by moving the vapor supply nozzle 47 outward from the substrate 3 and simultaneously moving the polymer removing liquid to the position above the center of the substrate 3. Therefore, the surface of the substrate 3 is cleaned with the polymer removing liquid.

Figure 9A:
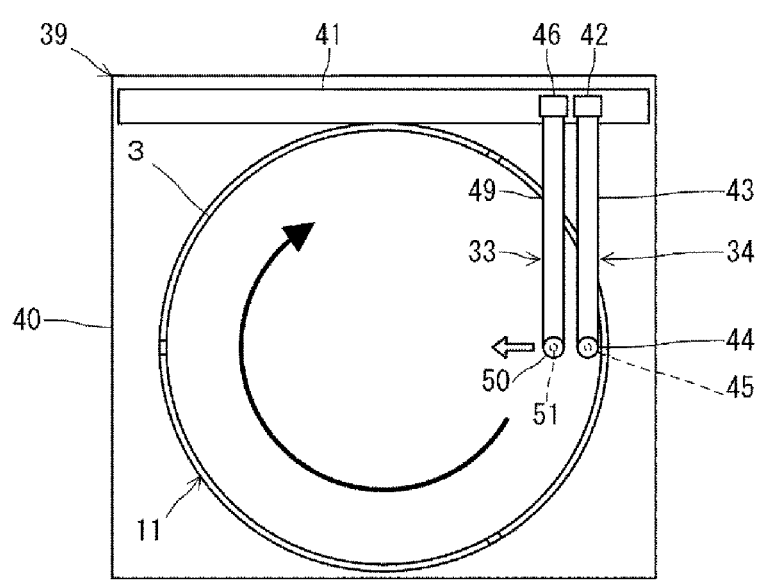
FIGS. 9A and 9B are a plan view and a side view illustrating a substrate processing apparatus.
Figure 9B:
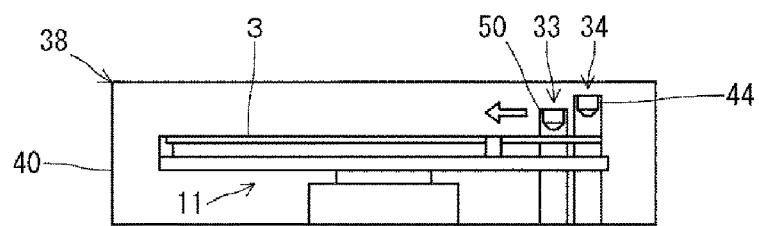

In the pre-treatment supplying unit 33 of the substrate processing apparatus 39 as illustrated in FIGS. 9A and 9B, an arm 49 that extends horizontally in the back and forth direction is attached to the upper portion of the moving body 46 that moves along the guide rail 41, and a vapor supply nozzle 50 is attached to the front end of the arm 49. The vapor is ejected from a vapor ejection port 51 formed in the lower portion of the vapor supply nozzle 50 toward the surface of the substrate 3. Here, the polymer supply nozzle 44 and the vapor supply nozzle 50 are attached to different arms 43, 49, respectively, but the nozzles may be attached to the same arm. In this case, the vapor supply nozzle 50 is disposed inward of the polymer removing liquid supply nozzle 44 with respect to the substrate 3.

In addition, in the substrate processing apparatus 39 as illustrated in FIGS. 9A and 9B, the vapor supply nozzle 50 and the polymer removing liquid supply nozzle 44 are moved outward from the substrate 3 while the substrate 3 is rotated by the substrate rotating unit 11. At this time, the vapor supply nozzle 50 is disposed inward of the polymer removing liquid supply nozzle 44 with respect to the substrate 3. Then, the vapor is ejected toward the surface of the substrate 3 while the vapor supply nozzle 50 is moved along the substrate 3, and simultaneously, the polymer removing liquid is ejected toward the surface of the substrate 3 while the polymer removing liquid supply nozzle 44 is moved along the substrate 3. Therefore, the surface of the substrate 3 is cleaned with the polymer removing liquid supplied after the vapor as the pre-treatment agent is supplied to the surface of the substrate 3. Since the vapor is supplied to the surface of the substrate 3, the liquid film formed on the surface of the substrate 3 is thin and easily dried. Accordingly, when the polymer removing liquid is supplied immediately after the vapor is supplied to the surface of the substrate 3, the surface of the substrate 3 may be cleaned with the polymer removing liquid before the surface is dried. Thus, the cleaning effect by the polymer removing liquid may be further enhanced.

As described above, in the substrate processing apparatus 38 as illustrated in FIGS. 8A and 8B, the polymer removing liquid is supplied to the entire surface of the substrate 3 after the pre-treatment agent is supplied to the entire surface of the substrate 3. That is, the entire surface of the substrate 3 is cleaned with the polymer removing liquid after the entire surface of the substrate 3 is pre-treated with the pre-treatment agent. On the other hand, in the substrate processing apparatus 39 as illustrated in FIGS. 9A and 9B, the pre-treatment is supplied partially to the surface of the substrate, and immediately thereafter, the polymer removing liquid is supplied partially to the portion supplied with the pre-treatment agent. That is, the cleaning processing after the surface of the substrate 3 is pre-treated partially is performed with respect to the entire surface of the substrate 3. The supply of the pre-treatment agent and the polymer removing liquid in the present disclosure may be performed in either manner.

As described above, in the substrate processing apparatus 1 (the substrate processing method performed by the substrate processing apparatus 1), the etched substrate 3 is subjected to the pre-treatment by supplying the pre-treatment agent composed of any of deionized water and IPA, ammonia water, ammonia water and IPA, water vapor, and IPA vapor to the substrate 3 before the etched substrate 3 is cleaned with the polymer removing liquid. Therefore, the cleaning effect by the polymer removing liquid may be enhanced, residues such as fluorine may be suppressed from remaining on the substrate 3, and the electric characteristics of the substrate 3 may be enhanced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method of cleaning an etched substrate with a polymer removing liquid, the method comprising:

supplying either isopropyl alcohol (IPA) vapor or water vapor to a surface of the etched substrate, thereby forming either a film of the IPA or a film of the water on the surface of the etched substrate;

after the supplying either the IPA vapor or the water vapor, supplying polymer removing liquid to the surface of the etched substrate such that either the film of the IPA or the film of the water is washed away from the surface of the etched substrate, and a film of the polymer removing liquid is formed on the surface of the etched substrate;

after the supplying the polymer removing liquid, supplying a deionized water on the surface of the etched substrate such that the film of the polymer removing liquid is washed away from the surface of the etched substrate; and rotating a turntable on which the etched substrate is held at a predetermined rotation speed thereby drying the surface of the etched substrate.

2. A substrate processing method of cleaning an etched substrate with a polymer removing liquid, the method comprising:

supplying deionized water (DIW) and isopropyl alcohol (IPA) to a surface of the etched substrate at the same time for a predetermined period of time at a predetermined ratio value, thereby forming a film of the DIW and the IPA on the surface of the etched substrate;

after supplying the DIW and the IPA, supplying polymer removing liquid to the surface of the etched substrate such that the film of the DIW and the IPA is washed away from the surface of the etched substrate, and a film of the polymer removing liquid is formed on the surface of the etched substrate;

after the supplying the polymer removing liquid, supplying the DIW on the surface of the etched substrate such that the film of the polymer removing liquid is washed away from the surface of the substrate; and rotating a turntable on which the substrate is held at a predetermined rotation speed thereby drying the surface of the etched substrate.

3. The substrate processing method of claim 2, wherein the IPA is solely supplied to the surface of the etched substrate before the DIW and the IPA are supplied at the same time such that a film of the IPA is formed on the surface of the etched substrate before the DIW and the IPA are supplied to the surface of the etched substrate.

4. The substrate processing method of claim 3, wherein a rotation speed of the etched substrate when the isopropyl alcohol is solely supplied is higher than that of the etched substrate when the DIW and the IPA are supplied at the same time.

5. The substrate processing method of claim 2, wherein the IPA is solely supplied after the DIW and the IPA are supplied at the same time such that a film of the IPA is formed on the surface of the etched substrate after the film of the DIW and the IPA is formed.

6. The substrate processing method of claim 5, wherein the polymer removing liquid is supplied after the supplying of the IPA is stopped, and the substrate is rotated at a rotation speed capable of maintaining the film of the IPA temporarily.

7. The substrate processing method of claim 2, wherein the predetermined ratio value of the DIW and the IPA ranges from 10:1 to 1:1, and the predetermined period of time is about 10 seconds.

8. The substrate processing method of claim 2, wherein a rotation speed of the etched substrate when the DIW and the IPA are supplied at the same time is set to a speed capable of maintaining a film of the DIW and the IPA.

9. A substrate processing method of cleaning an etched substrate with a polymer removing liquid, the method comprising:

supplying ammonia water to a surface of the etched substrate for a predetermined period of time at a predetermined concentration value, or supplying the ammonia water and isopropyl alcohol (IPA) to the surface of the substrate at the same time, thereby forming either a film of the ammonia water or a film of the ammonia water and the IPA;

after supplying the ammonia water or supplying the ammonia water and the IPA, supplying the polymer removing liquid to the surface of the etched substrate such that either the film of the ammonia water or the film of the ammonia water and the IPA is washed away from the surface of the etched substrate, and a film of the polymer removing liquid is formed;

after the supplying the polymer removing liquid, supplying deionized water to the surface of the etched substrate such that the film of the polymer removing liquid is washed away from the surface of the etched substrate; and rotating a turntable on which the etched substrate is held at a predetermined rotation speed thereby drying the surface of the etched substrate.

* * * * *